(12) United States Patent
Bengtson

(10) Patent No.: US 7,729,451 B2
(45) Date of Patent: Jun. 1, 2010

(54) CALIBRATION SOURCE FOR A RECEIVER

(75) Inventor: David Bengtson, Easton, PA (US)

(73) Assignee: Agere Systems Inc., Allentown, PA (US)

( * ) Notice: Subject to any disclaimer, the term of this patent is extended or adjusted under 35 U.S.C. 154(b) by 918 days.

(21) Appl. No.: 11/535,224

(22) Filed: Sep. 26, 2006

(65) Prior Publication Data

US 2008/0075199 A1    Mar. 27, 2008

(51) Int. Cl.
*H03K 9/00* (2006.01)
(52) U.S. Cl. .................. 375/316; 455/67.11; 455/226.1
(58) Field of Classification Search .................. 375/316, 375/317, 319; 455/67.11, 67.14, 226.1
See application file for complete search history.

(56) References Cited

U.S. PATENT DOCUMENTS 6,542,043 B1   4/2003   Cao
6,670,900 B1   12/2003  Zhang
2005/0069056 A1 *  3/2005  Willingham ................ 375/327

OTHER PUBLICATIONS

"A Single-Chip Digitally Calibrated 5.15-5.825-GHz 0.18-μm CMOS Transceiver for 802.11a Wireless LAN," by I. Vassiliou, K. Vavelidis, T. Georgantas, et al., IEEE J. Solid-State Circuits, 2003, vol. 38, No. 12, pp. 2221-31.

* cited by examiner

*Primary Examiner*—Kevin Y Kim
(74) *Attorney, Agent, or Firm*—Mendelsohn, Drucker & Associates, P.C.; Yuri Gruzdkov; Steve Mendelsohn

(57) ABSTRACT

A receiver having a circuit configurable to function as a low-noise amplifier or a calibration source and having at least one circuit element that is shared between these two circuit functions. Advantageously, the shared circuit element saves at least the amount of die area that would have been taken by a second instance of that circuit element.

18 Claims, 2 Drawing Sheets

100

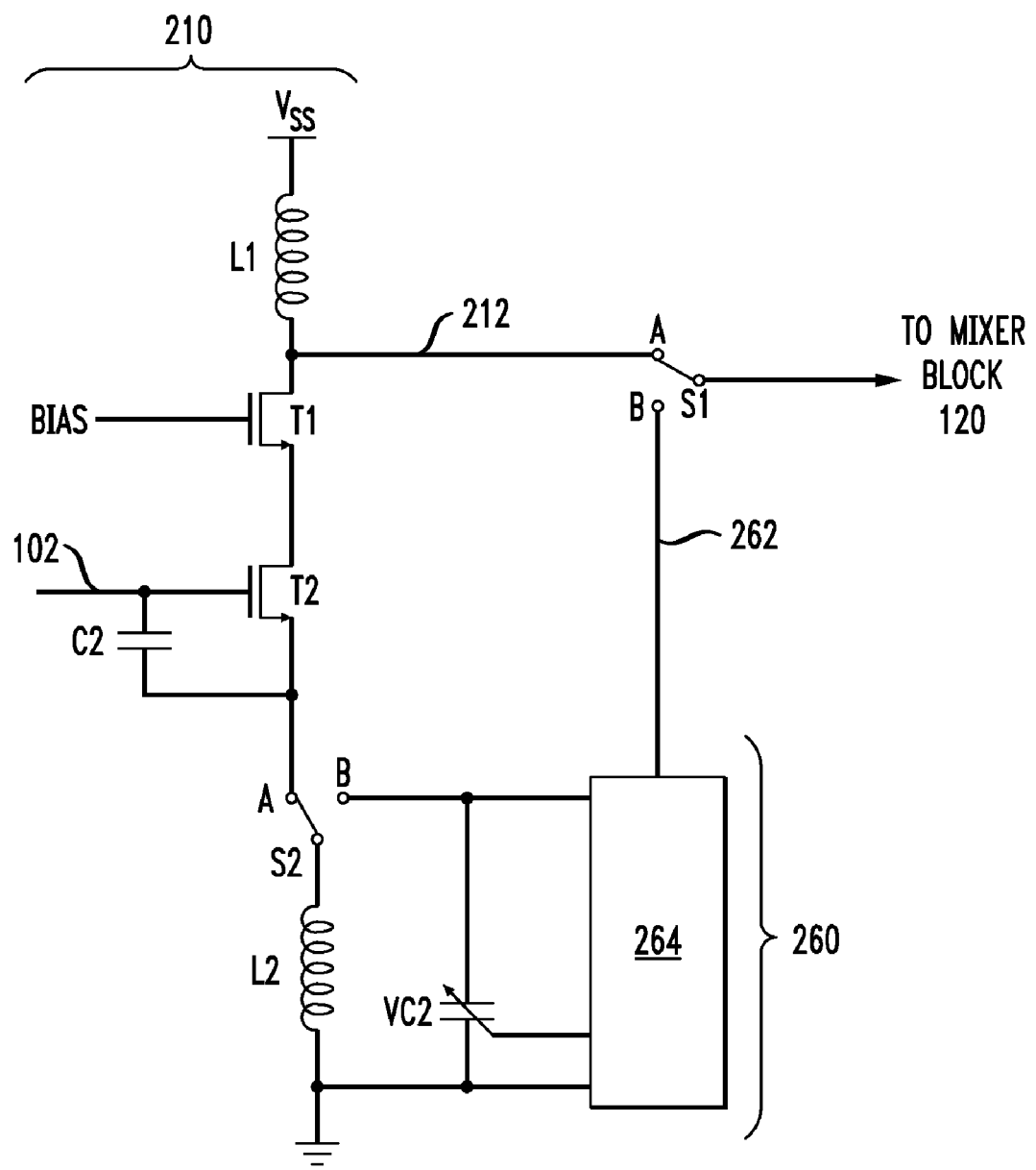

CALIBRATION SOURCE FOR A RECEIVER

BACKGROUND OF THE INVENTION

1. Field of the Invention

The present invention relates to communications equipment and, more specifically, to a signal receiver, such as a quadrature modulation receiver.

2. Description of the Related Art

The use of quadrature modulation is a common communication technique for transmitting data, such as digitized audio streams. More specifically, the data to be transmitted are encoded using (1) an "in-phase" (I) modulation signal and (2) a "quadrature-phase" (Q) modulation signal that has a 90-degree phase difference with the in-phase modulation signal. The I and Q modulation signals are combined to form a composite I/Q signal, which is then transmitted over the communication channel.

One example of a quadrature modulation communications system is a system that complies with the IEEE 802.11a/g standards. More specifically, the IEEE 802.11a/g standards specify an orthogonal frequency division multiplexing (OFDM) scheme that employs a combination of frequency division multiplexing and quadrature modulation. At an OFDM transmitter, a plurality of composite I/Q signals (OFDM sub-carriers) are frequency-division-multiplexed for transmission to a corresponding OFDM receiver so that, in the frequency domain, the primary peak of each OFDM sub-carrier coincides with a null of every other OFDM sub-carrier. As a result, in the transmitted signal, not only are the I and Q components of each OFDM sub-carrier orthogonal to one another, but also different OFDM sub-carriers are mutually orthogonal as well. These multiple orthogonality relationships advantageously enable an OFDM communications system to reliably demodulate the transmitted signal at the receiver, while operating at relatively high spectral data-transmission density.

One problem with quadrature modulation communications systems in general and OFDM systems in particular is that they are relatively sensitive to deviations from the above-specified orthogonality relationships. As a result, a quadrature modulation transmitter/receiver usually incorporates one or more calibration sources that are used to maintain signal orthogonality at various modulation/demodulation stages. However, disadvantageously, these calibration sources can take up a significant die area, thereby increasing the size and/or cost of the chip set implementing the transmitter/receiver.

SUMMARY OF THE INVENTION

Problems in the prior art are addressed by various embodiments of a receiver having a circuit configurable to function either as a low-noise amplifier or a calibration source and having at least one circuit element that is shared between these two circuit functions. Advantageously, the shared circuit element saves at least the amount of die area that would have been taken by a second instance of that circuit element.

In one embodiment, a receiver of the invention has: (A) a demodulation circuit having a first demodulation path for demodulating the in-phase (I) component of a received quadrature modulation signal and a second demodulation path for demodulating the quadrature-phase (Q) component of that quadrature modulation signal; and (B) a configurable circuit adapted to: (i) in one configuration, amplify the received quadrature modulation signal and apply the resulting amplified signal to the demodulation circuit for subsequent demodulation processing therein and (ii) in another configuration, generate a calibration signal and apply that calibration signal to the demodulation circuit to enable the receiver to attain desirable phase and gain characteristics for the I and Q demodulation paths and maintain orthogonality between the I and Q components of the quadrature modulation signal. The configurable circuit has an inductor that is used to generate both the amplified and calibration signals.

According to one embodiment, the present invention is a receiver for processing a modulated signal comprising a demodulation circuit and a configurable circuit. The demodulation circuit is adapted to demodulate the modulated signal. The configurable circuit is adapted to: (i) in a first configuration of said configurable circuit, amplify the modulated signal and apply a resulting amplified signal to said demodulation circuit; and (ii) in a second configuration of said configurable circuit, generate a calibration signal and apply said calibration signal to said demodulation circuit. The receiver is adapted to use the calibration signal to tune said demodulation circuit. The configurable circuit comprises at least one circuit element that is used by the configurable circuit to generate (i) the amplified signal in the first configuration and (ii) the calibration signal in the second configuration.

According to another embodiment, the present invention is a method of processing a modulated signal. The method comprises selecting one of at least first and second configurations for a configurable circuit of a receiver having a demodulation circuit and the configurable circuit. The demodulation circuit is adapted to demodulate the modulated signal. The configurable circuit is adapted to: (i) in a first configuration of said configurable circuit, amplify the modulated signal and apply a resulting amplified signal to said demodulation circuit; and (ii) in a second configuration of said configurable circuit, generate a calibration signal and apply said calibration signal to said demodulation circuit. The receiver is adapted to use the calibration signal to tune said demodulation circuit. The configurable circuit comprises at least one circuit element that is used by the configurable circuit to generate (i) the amplified signal in the first configuration and (ii) the calibration signal in the second configuration.

BRIEF DESCRIPTION OF THE DRAWINGS

Other aspects, features, and benefits of the present invention will become more fully apparent from the following detailed description, the appended claims, and the accompanying drawings in which:

FIG. 2 shows a block diagram of a circuit that can be used in the receiver of FIG. 1 in place of the low-noise amplifier (LNA) and calibration source according to one embodiment of the invention.

DETAILED DESCRIPTION

Figure 1:
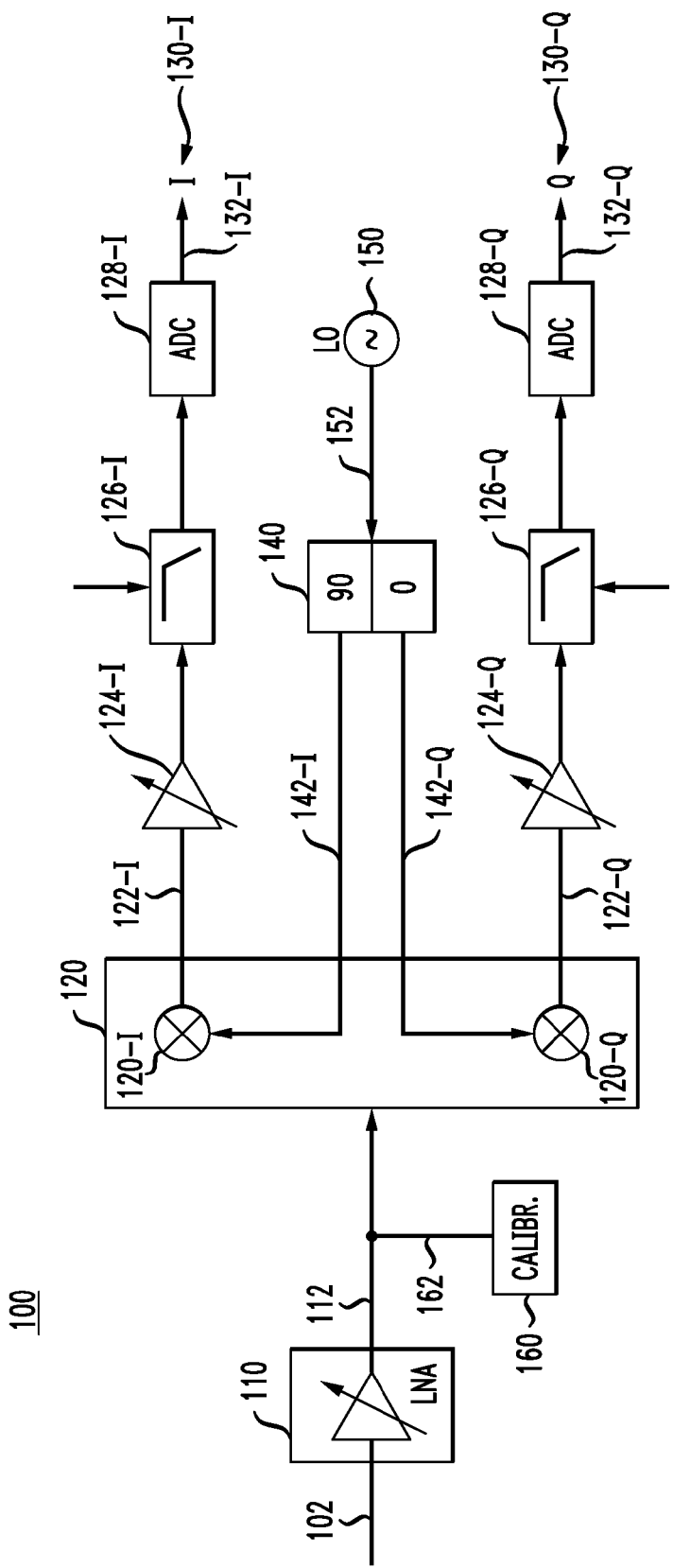
FIG. 1 shows a block diagram of a prior-art quadrature modulation receiver.

FIG. 1 shows a block diagram of a prior-art quadrature modulation receiver 100. An input signal 102 applied to receiver 100, e.g., by an antenna (not shown), is amplified in a low-noise amplifier (LNA) 110 and a resulting amplified signal 112 is directed to a mixer block 120 for frequency down-conversion. Mixer block 120 splits signal 112 into two copies and mixes the copies in mixers 120-I and 120-Q with reference signals 142-I and 142-Q, respectively. Reference signals 142-I and 142-Q are generated using (i) a local oscillator (LO) 150 operating at the carrier frequency and having its phase locked to the quadrature phase and (ii) a phase shifter 140 coupled to that LO. Phase shifter 140 splits an output signal 152 generated by LO 150 into two signal copies and applies to these signal copies phase shifts of 90 and 0 degrees, respectively. The 90-degree shifted copy becomes reference signal 142-I, while the other copy becomes reference signal 142-Q.

Output signals 122-I and 122-Q generated by mixers 120-I and 120-Q, respectively, are directed along two analogous (I and Q) signal paths 130, with each signal path having a tunable amplifier 124, a tunable low-pass filter 126, and an analog-to-digital converter (ADC) 128. Digital output signals 132-I and 132-Q emerging from signal paths 130-I and 130-Q represent the I and Q baseband signals, respectively. An external digital signal processor (not shown) processes signals 132-I and 132-Q to recover the data carried by signal 102.

Signal 102 is properly demodulated in receiver 100 when signal paths 130-I and 130-Q have substantially identical phase and gain characteristics. Conversely, a mismatch in the characteristics of signal paths 130-I and 130-Q (often referred to as an I/Q mismatch) can lead to a signal processing error. To maintain the I/Q mismatch below a certain acceptable threshold level, receiver 100 is typically configured to periodically tune amplifiers 124 and filters 126 to adjust the phase and/or gain characteristics of signal paths 130. More specifically, LNA 110 is temporarily disabled and a calibration signal 162 generated by a calibration source 160 is applied to mixer block 120 in lieu of signal 112. In one representative configuration, signal 162 has a constant amplitude while its phase rotates in the I/Q plane. If the phase and gain characteristics of signal paths 130-I and 130-Q are perfectly matched, then the demodulated signal appears as a perfect circle, when plotted in the I/Q plane. However, in the presence of an I/Q mismatch, the demodulated signal will appear as an ellipse, whose properties can be analyzed to quantify the I/Q mismatch. Based on this quantification, amplifiers 124 and filters 126 can then be tuned to reduce the I/Q mismatch to an acceptable level.

When receiver 100 is a part of a transceiver, the transmitter of that transceiver can be configured to serve as calibration source 160. Representative transceivers utilizing this calibration approach are described, e.g., in U.S. Pat. No. 6,670,900 and an article by I. Vassiliou, K. Vavelidis, T. Georgantas, et al., entitled "A Single-Chip Digitally Calibrated 5.15-5.825-GHz 0.18-μm CMOS Transceiver for 802.11a Wireless LAN" and published in IEEE J. Solid-State Circuits, 2003, vol. 38, No. 12, pp. 2221-31, the teachings of both of which are incorporated herein by reference. However, when receiver 100 is a stand-alone receiver, i.e., is not a part of a transceiver, calibration source 160 is typically a dedicated oscillator. Disadvantageously, this dedicated oscillator can take up a significant die area, thereby increasing the size and/or cost of receiver 100.

FIG. 2 shows a block diagram of a circuit 200 that can be used in receiver 100 (FIG. 1) in place of LNA 110 and calibration source 160 according to one embodiment of the invention. Circuit 200 has switches S1 and S2 that configure that circuit to function: (i) in position A, as an LNA analogous to LNA 110 and (ii) in position B, as a calibration source analogous to calibration source 160 (see FIG. 1). Compared to the combination of LNA 110 and calibration source 160 in a stand-alone receiver 100, circuit 200 can advantageously save die area because switches S1 and S2 enable the latter circuit to share certain circuit elements between the two above-specified circuit functions. For example, circuit 200 has an inductor (labeled L2 in FIG. 2) that is shared by an LNA 210 and an oscillator 260 of that circuit. Since inductor L2 is typically one of the largest individual components on the die, its shared utilization in circuit 200 by LNA 210 and oscillator 260 advantageously saves at least an amount of die area that otherwise would have been taken by a second instance of that inductor. One skilled in the art will appreciate that additional die-area savings can be achieved by designing LNA 210 and oscillator 260 so that they share additional circuit elements, e.g., capacitors, resistors, and/or transistors.

When switches S1 and S2 are in position A, oscillator 260 is disabled and circuit 200 is configured to operate as an LNA using LNA 210. Input signal 102 (see also FIG. 1) is applied to the gate of transistor T2 to modulate the current flowing through that transistor and produce an amplified signal 212 analogous to amplified signal 112 of FIG. 1 at the circuit point located between bias transistor T1 and load inductor L1. A primary function of inductor L2 (together with capacitor C2) in LNA 210 is to achieve proper input impedance matching (usually 50 Ohm) for the LNA, which typically forces that inductor to be the largest individual circuit component on the die having circuit 200.

Although, in the embodiment of FIG. 2, circuit 200 is shown as having LNA 210, one skilled in the art will appreciate that, in an alternative embodiment, circuit 200 can similarly employ a different suitable LNA. Similar to LNA 210, an alternative LNA will typically have an impedance-matching inductor analogous to inductor L2. Consequently, in an embodiment of circuit 200 having that alternative LNA, the impedance-matching inductor will be shared between the LNA and oscillator 260.

When switches S1 and S2 are in position B, LNA 210 is disabled and circuit 200 is configured to operate as a calibration source using oscillator 260. An output signal 262 generated by oscillator 260 is applied to mixer block 120 and used therein similar to signal 162 (see FIG. 1). A primary function of inductor L2 (together with variable capacitor VC2) in oscillator 260 is to set the frequency of output signal 262.

In one embodiment, oscillator 260 comprises a phase-locked loop (PLL), with inductor L2 and variable capacitor VC2 being parts of the PLL's voltage-controlled oscillator (VCO). For clarity, PLL circuit elements other than inductor L2 and variable capacitor VC2 are not explicitly shown in FIG. 2, and the PLL's phase detector, loop filter, frequency divider, and additional components of the VCO are lumped together in a circuit block 264. A detailed description of a PLL that can be used in oscillator 260 can be found, e.g., in U.S. Pat. No. 6,542,043, which is incorporated herein by reference in its entirety. One skilled in the art will also appreciate that, in an alternative embodiment, circuit 200 can similarly employ a different suitable oscillator that employs, for frequency generation and/or selection, an inductor similar to inductor L2 of oscillator 260.

While this invention has been described with reference to illustrative embodiments, this description is not intended to be construed in a limiting sense. Although embodiments of the present invention have been described in reference to quadrature modulation signals, they can similarly be used for processing other types of signals. The present invention may be implemented on a single integrated circuit, a multi-chip module, a single card, or a multi-card circuit pack. Various modifications of the described embodiments, as well as other embodiments of the invention, which are apparent to persons skilled in the art to which the invention pertains are deemed to lie within the principle and scope of the invention as expressed in the following claims.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

I claim:

1. A receiver for processing a modulated signal, comprising:
    a demodulation circuit adapted to demodulate the modulated signal; and
    a configurable circuit adapted to:
        in a first configuration of said configurable circuit, amplify the modulated signal and apply a resulting amplified signal to said demodulation circuit; and
        in a second configuration of said configurable circuit, generate a calibration signal and apply said calibration signal to said demodulation circuit, wherein:
            the receiver is adapted to use the calibration signal to tune said demodulation circuit; and
            the configurable circuit comprises an inductor that is used by the configurable circuit to generate (i) the amplified signal in the first configuration and (ii) the calibration signal in the second configuration.

2. The invention of claim 1, wherein:
    the modulation signal has an in-phase (I) component and a quadrature-phase (Q) component;
    the demodulation circuit comprises a first demodulation path for demodulating the I component and a second demodulation path for demodulating the Q component; and
    the receiver is adapted to use the calibration signal to attain desirable characteristics for the first and second demodulation paths.

3. The invention of claim 1, wherein:
    the configurable circuit comprises a low-noise amplifier (LNA) adapted to generate the amplified signal; and
    the inductor is adapted to define input impedance of the LNA.

4. The invention of claim 3, wherein:
    the configurable circuit further comprises an oscillator adapted to generate the calibration signal; and
    the inductor is adapted to define the frequency of the calibration signal.

5. The invention of claim 4, wherein:
    the configurable circuit further comprises one or more switches;
    in the first configuration, said one or more switches disable the oscillator and couple the amplified signal to the demodulation circuit; and
    in the second configuration, said one or more switches disable the LNA and couple the calibration signal to the demodulation circuit.

6. The invention of claim 1, wherein:
    the configurable circuit comprises an oscillator adapted to generate the calibration signal; and
    the inductor is adapted to define the frequency of the calibration signal.

7. The invention of claim 6, wherein:
    the oscillator comprises a phase-locked loop having a voltage-controlled oscillator (VCO); and
    the inductor is a part of the VCO.

8. The invention of claim 1, wherein the receiver is a stand-alone receiver.

9. The invention of claim 1, wherein the demodulation circuit and the configurable circuit are parts of an integrated circuit.

10. A method of processing a modulated signal, comprising:
    selecting one of at least first and second configurations for a configurable circuit of a receiver, wherein:
        the receiver comprises:
            a demodulation circuit adapted to demodulate the modulated signal; and
            the configurable circuit being adapted to:
                in the first configuration, amplify the modulated signal and apply a resulting amplified signal to said demodulation circuit; and
                in the second configuration, generate a calibration signal and apply said calibration signal to said demodulation circuit, wherein:
                    the receiver is adapted to use the calibration signal to tune the demodulation circuit; and
                    the configurable circuit comprises an inductor that is used by the configurable circuit to generate (i) the amplified signal in the first configuration and (ii) the calibration signal in the second configuration.

11. The invention of claim 10, wherein:
    the modulation signal has an in-phase (I) component and a quadrature-phase (Q) component;
    the demodulation circuit comprises a first demodulation path for demodulating the I component and a second demodulation path for demodulating the Q component; and
    the receiver is adapted to use the calibration signal to attain desirable characteristics for the first and second demodulation paths.

12. The invention of claim 10, wherein:
    the configurable circuit comprises a low-noise amplifier (LNA) adapted to generate the amplified signal; and
    the inductor is adapted to define input impedance of the LNA.

13. The invention of claim 12, wherein:
    the configurable circuit further comprises an oscillator adapted to generate the calibration signal; and
    the inductor is adapted to define the frequency of the calibration signal.

14. The invention of claim 13, wherein:
    the configurable circuit further comprises one or more switches; and
    the step of selecting comprises:
        configuring said one or more switches to disable the oscillator and couple the amplified signal to the demodulation circuit, whereby selecting the first configuration; and configuring said one or more switches to disable the LNA and couple the calibration signal to the demodulation circuit, whereby selecting the second configuration.

15. The invention of claim 10, wherein:

the configurable circuit comprises an oscillator adapted to generate the calibration signal; and the inductor is adapted to define the frequency of the calibration signal.

16. The invention of claim 15, wherein:

the oscillator comprises a phase-locked loop having a voltage-controlled oscillator (VCO); and the inductor is a part of the VCO.

17. The invention of claim 10, wherein the receiver is a stand-alone receiver.

18. The invention of claim 10, wherein the demodulation circuit and the configugurable circuit are parts of an integrated circuit.

* * * * *